(12) United States Patent
Lin

(10) Patent No.: US 10,777,522 B2
(45) Date of Patent: Sep. 15, 2020

(54) SEMICONDUCTOR STRUCTURE AND METHOD OF MANUFACTURING THE SAME

(71) Applicant: NANYA TECHNOLOGY CORPORATION, New Taipei (TW)

(72) Inventor: Chih-Ching Lin, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/275,921

(22) Filed: Feb. 14, 2019

(65) Prior Publication Data

US 2020/0211991 A1 Jul. 2, 2020

Related U.S. Application Data

(60) Provisional application No. 62/785,387, filed on Dec. 27, 2018.

(51) Int. Cl.
*H01L 23/00* (2006.01)

(52) U.S. Cl.
CPC .............. *H01L 24/13* (2013.01); *H01L 24/11* (2013.01); *H01L 2224/1162* (2013.01);
(Continued)

(58) Field of Classification Search
CPC ......... H01L 24/11; H01L 24/13; H01L 24/30; H01L 24/33; H01L 24/17; H01L 24/38; H01L 24/41; H01L 24/46; H01L 24/49; H01L 24/67; H01L 24/70; H01L 2224/1191; H01L 2224/1162; H01L 2224/11614; H01L 2224/13017; H01L 2224/13084; H01L 2224/13147; H01L 2224/13166; H01L 2224/13181; H01L 2224/13186; H01L 2224/13563; H01L 2224/13582; H01L 2924/04941;
(Continued)

(56) References Cited

U.S. PATENT DOCUMENTS

| 2010/0221888 | A1 | 9/2010 | Ho | |
|---|---|---|---|---|
| 2014/0264853 | A1* | 9/2014 | Lin | ..................... H01L 23/3192 257/738 |

(Continued)

FOREIGN PATENT DOCUMENTS

| TW | 201730996 A | 9/2017 |
|---|---|---|
| TW | 201803171 A | 1/2018 |

OTHER PUBLICATIONS

Office Action dated Dec. 4, 2019 related to Taiwanese Application No. 108109568.

*Primary Examiner* — Chuong A Luu
(74) *Attorney, Agent, or Firm* — Muncy, Geissler, Olds & Lowe, P.C.

(57) ABSTRACT

The present disclosure provides a semiconductor structure and a method of manufacturing the semiconductor structure. The semiconductor structure includes a substrate, a plurality of metallic pillars, a plurality of metallic protrusions, a capping layer, and a passivation layer. The metallic pillars are disposed on the substrate. The metallic protrusions extend from an upper surface of the metallic pillars. The capping layer is disposed on the metallic protrusions. The passivation layer is disposed on sidewalls of the protrusions and the capping layer.

10 Claims, 9 Drawing Sheets

(52) U.S. Cl.
CPC ......... *H01L 2224/1191* (2013.01); *H01L 2224/11614* (2013.01); *H01L 2224/13017* (2013.01); *H01L 2224/13084* (2013.01); *H01L 2224/13124* (2013.01); *H01L 2224/13147* (2013.01); *H01L 2224/13166* (2013.01); *H01L 2224/13181* (2013.01); *H01L 2224/13186* (2013.01); *H01L 2224/13563* (2013.01); *H01L 2224/13582* (2013.01); *H01L 2924/04941* (2013.01); *H01L 2924/04953* (2013.01); *H01L 2924/0534* (2013.01); *H01L 2924/05342* (2013.01); *H01L 2924/05442* (2013.01)

(58) Field of Classification Search
CPC ... H01L 2924/04953; H01L 2924/0534; H01L 2924/05342; H01L 2924/05442
USPC ....................................................... 257/737
See application file for complete search history.

(56) References Cited

U.S. PATENT DOCUMENTS

2014/0273430 A1  9/2014  Naik et al.
2018/0151525 A1  5/2018  Cheng et al.

\* cited by examiner

SEMICONDUCTOR STRUCTURE AND METHOD OF MANUFACTURING THE SAME

PRIORITY CLAIM AND CROSS-REFERENCE

This application claims the priority benefit of U.S. provisional application Ser. No. 62/785,387, filed on Dec. 27, 2018. The entirety of the above-mentioned patent application is hereby incorporated by reference herein and made a part of this specification.

TECHNICAL FIELD

The present disclosure relates to a semiconductor structure and a method of manufacturing the same, and more particularly, to a high-aspect ratio metallic interconnect on a semiconductor substrate and a method of manufacturing the same.

DISCUSSION OF THE BACKGROUND

Semiconductor devices and integrated circuits are becoming more highly integrated. As a result, research is ongoing to improve characteristics of these devices and circuits, and to achieve desirable process margins. Therefore, photolithography processes for forming a pattern over a wafer are important parts of a microlithography process.

In general, interconnect layers are patterned and then etched to form conducting lines. However, at the completion of the etching process, reentrant undercutting has been observed at the interface of the metallic layer and the anti-reflection coating layer, which can lead to undesirable voids during subsequent filling with an inter-metal layer dielectric or, in the worst case, subsequent lifting of the aluminum layer, either of which degrades the yield of semiconductor devices.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate, a plurality of metallic pillars, a plurality of metallic protrusions, a capping layer, and a passivation layer. The metallic pillars are disposed on the substrate. The metallic protrusions extend from an upper surface of the metallic pillars. The capping layer is disposed on the metallic protrusions. The passivation layer is disposed on sidewalls of the metallic protrusions and the capping layer.

In some embodiments, the sidewalls of the metallic protrusions are discontinuous with sidewalls of the metallic pillars.

In some embodiments, the metallic protrusions have a width substantially less than a width of the metallic pillars.

In some embodiments, an included angle between a sidewall and a bottom wall of the metallic pillar is in a range between 80 and 90 degrees.

In some embodiments, the semiconductor structure further includes an anti-reflective coating layer sandwiched between the metallic protrusion and the capping layer.

In some embodiments, the metallic protrusions have a height substantially greater than twice a height of the anti-reflective coating layer.

In some embodiments, the semiconductor structure further includes an insulating layer and a barrier layer; the insulating layer separates the metallic pillars from the substrate, and the barrier layer is sandwiched between the insulating layer and the metallic pillars.

In some embodiments, the passivation layer comprises at least one first layer and at least one second layer arranged in a staggered configuration.

In some embodiments, the metallic pillars and the metallic protrusions are integrally formed.

In some embodiments, wherein an outer periphery of the passivation layer is continuous with the sidewalls of the metallic pillars.

Another aspect of the present disclosure provides a method of manufacturing the semiconductor structure. The method includes steps of providing a substrate; depositing a metallic layer and a capping layer on the substrate; patterning the capping layer to form a plurality of trenches penetrating through the capping layer and in the metallic layer, wherein the remaining metallic layer includes a base and a plurality of metallic protrusions connected to the base; depositing a passivation layer on sidewalls of the capping layer and the metallic protrusions; and etching the base through the trenches to form a plurality of metallic pillars underlying the respective metallic protrusions.

In some embodiments, the deposition of the passivation layer on the sidewalls of the capping layer and the metallic protrusions includes steps of depositing the passivation layer on a top surface of the capping layer, the sidewalls of the capping layer and the protrusions, and an upper surface of the base; and performing an etching process to remove the passivation layer from the top surface and the upper surface.

In some embodiments, included angles between the upper surface of the base and the sidewalls of the metallic protrusions substantially equal to 90 degrees.

In some embodiments, the passivation layer is formed by an atomic layer deposition process.

In some embodiments, the passivation layer has a uniform thickness.

In some embodiments, the patterning of the capping layer to form a plurality of trenches penetrating through the capping layer and in the metallic layer includes steps of coating a photoresist layer on the capping layer; patterning the photoresist layer to form a photoresist pattern having a plurality of openings; and removing a portion of the capping layer exposed through the openings.

In some embodiments, the method further includes steps of forming an insulating layer on the substrate; and depositing a barrier layer on the insulating layer before the deposition of the metallic layer.

In some embodiments, the method further includes a step of depositing an anti-reflective coating layer on the metallic layer before the deposition of the capping layer.

In some embodiments, the etching of the base using $Cl_2$ and $BCl_3$ as etchant gases.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
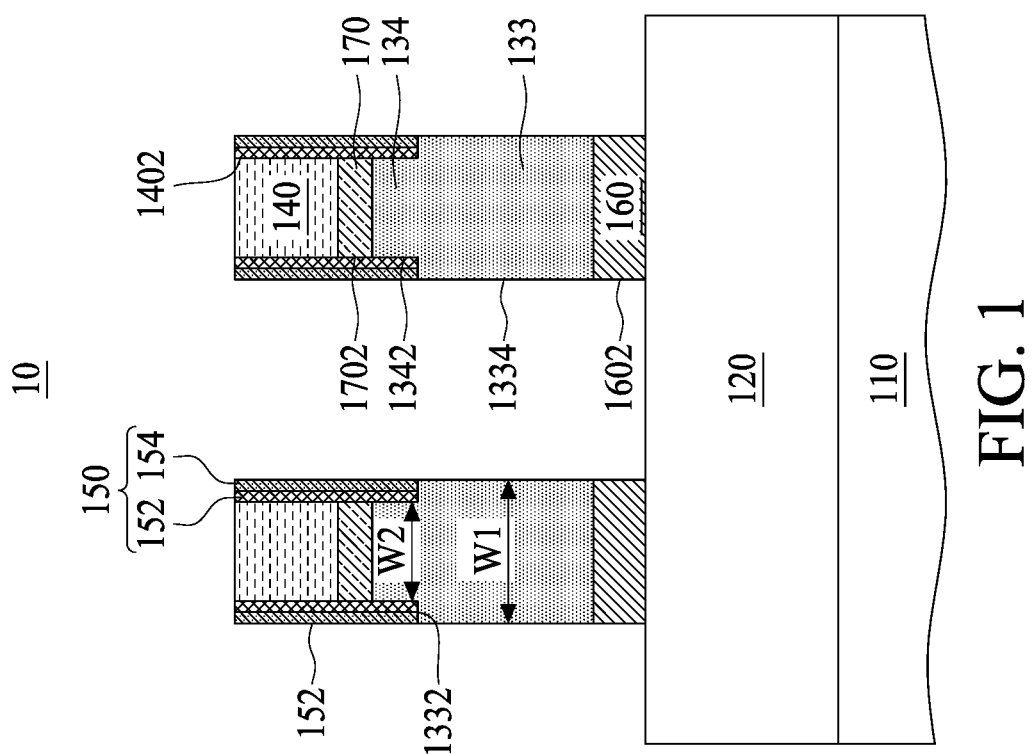
FIG. 1 is a cross-sectional view of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor structure 10 in accordance with some embodiments of the present disclosure. Referring to FIG. 1, the semiconductor structure 10 includes a semiconductor substrate 110, an insulating layer 120 disposed on the semiconductor substrate 110, a plurality of metallic pillars 133 disposed on the insulating layer 120, a plurality of metallic protrusions 134 extending from an upper surface 1332 of the metallic pillars 133, a capping layer 140 disposed on the metallic protrusions 134, and a passivation layer 150 disposed on sidewalls 1402 of the capping layer 140 and sidewalls 1342 of the metallic protrusions 134.

In some embodiments, the insulating layer 120 including oxide may be a thermal oxidation layer or a deposition layer. In some embodiments, the metallic pillars 133 and the metallic protrusions 134 are integrally formed. In some embodiments, the metallic pillars 133 have sidewalls 1334 that are discontinuous with the sidewalls 1342 of the metallic protrusions 134. In some embodiments, the metallic pillars 133 have a width W1 substantially greater than a width W2 of the metallic pillars 134. In some embodiments, the capping layer 140 includes dielectric such as nitride.

In some embodiments, the passivation layer 150 provides passivation in the etch environment to protect against undercutting or notches of the sidewalls 1342 of the metallic protrusions 134. In some embodiments, the passivation layer 150 includes dielectric. In some embodiments, the passivation layer 150 may include one or more first layers 152 and one or more second layers 154 arranged in a staggered configuration. In some embodiments, the first layers 152 include silicon dioxide ($SiO_2$). In some embodiments, the second layers 154 include zirconium dioxide ($ZrO_2$) or hafnium dioxide ($HfO_2$). In some embodiments, an outer periphery 152 of the passivation layer 150 is continuous with the sidewalls 1334 of the metallic pillars 133.

In some embodiments, the semiconductor structure 10 further includes a barrier layer 160 sandwiched between the insulating layer 120 and the metallic pillars 133. In some embodiments, the barrier layer 160 acts as a glue layer. In some embodiments, the barrier layer 160 may be a single-layered structure including titanium (Ti), titanium nitride (TiN), tantalum (Ta) or tantalum nitride (TaN). In some embodiments, the barrier layer 160 may have a multi-layered structure including one or more titanium layers and one or more titanium nitride layers; however, in some embodiments, the barrier layer 160 may be the multi-layered structure including one or more tantalum layers and one or more tantalum nitride layers. In some embodiments, sidewalls 1602 of the barrier layer 160 are continuous with sidewalls 1334 of the metallic pillars 133.

In some embodiments, the semiconductor structure 10 further includes an anti-reflective coating (ARC) layer 170 sandwiched between the metallic protrusions 134 and the capping layer 140. In some embodiments, the ARC layer 170 may be a multi-layered structure including at least one titanium layer and at least one titanium nitride layer. In some embodiments, the ARC layer 170 may be the multi-layered structure including at least one tantalum layer and at least one tantalum nitride layer. In some embodiments, the ARC layer 170 may be single-layered structure. In some embodiments, sidewalls 1702 of the ARC layer 170 are continuous with the sidewalls 1342 of the metallic protrusions 134.

Figure 2:
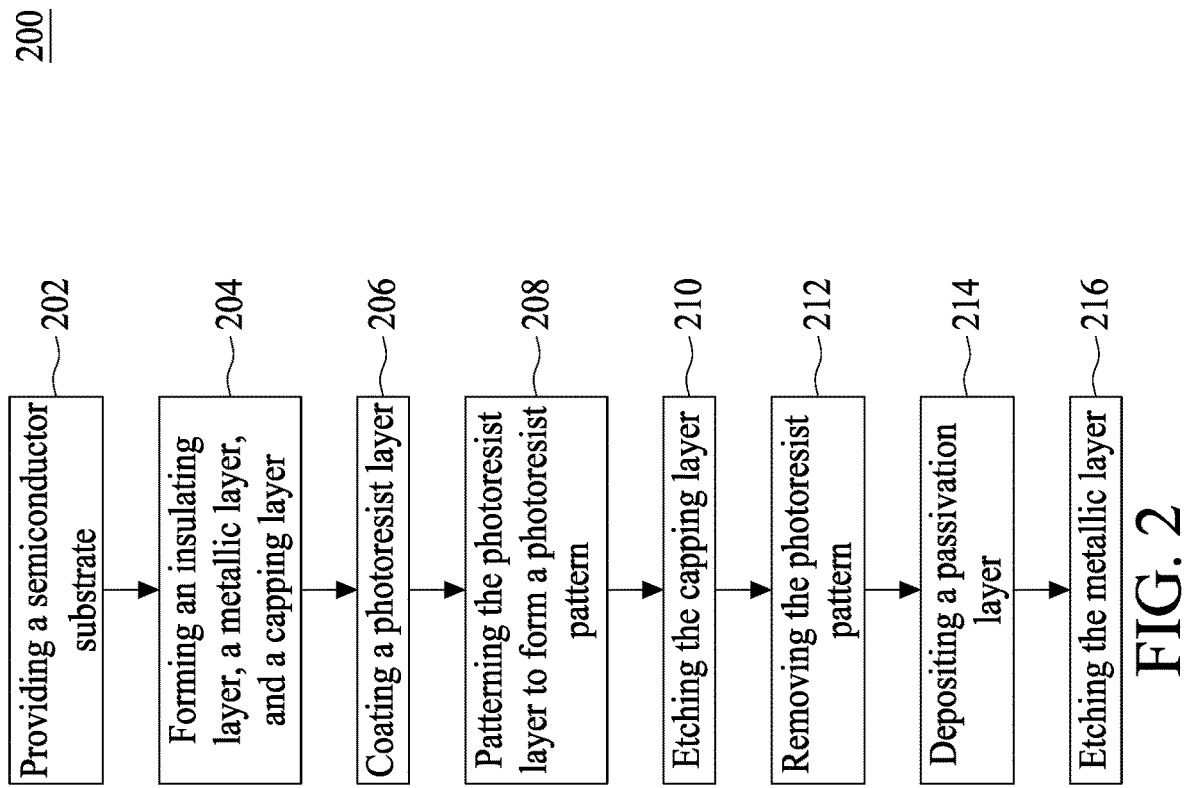
FIG. 2 is a flow diagram illustrating a method of manufacturing a semiconductor structure in accordance with some embodiments of the present disclosure.

FIG. 2 is a flow diagram illustrating a method 200 of manufacturing a semiconductor structure 10 in accordance with some embodiments of the present disclosure. FIGS. 3 to 9 are schematic diagrams illustrating various fabrication stages constructed according to the method 200 for manufacturing the semiconductor structure 10 in accordance with some embodiments of the present disclosure. The stages shown in FIGS. 3 to 9 are also illustrated schematically in the flow diagram in FIG. 2. In the subsequent discussion, the fabrication stages shown in FIGS. 3 to 9 are discussed in reference to the process steps in FIG. 2.

Figure 3:
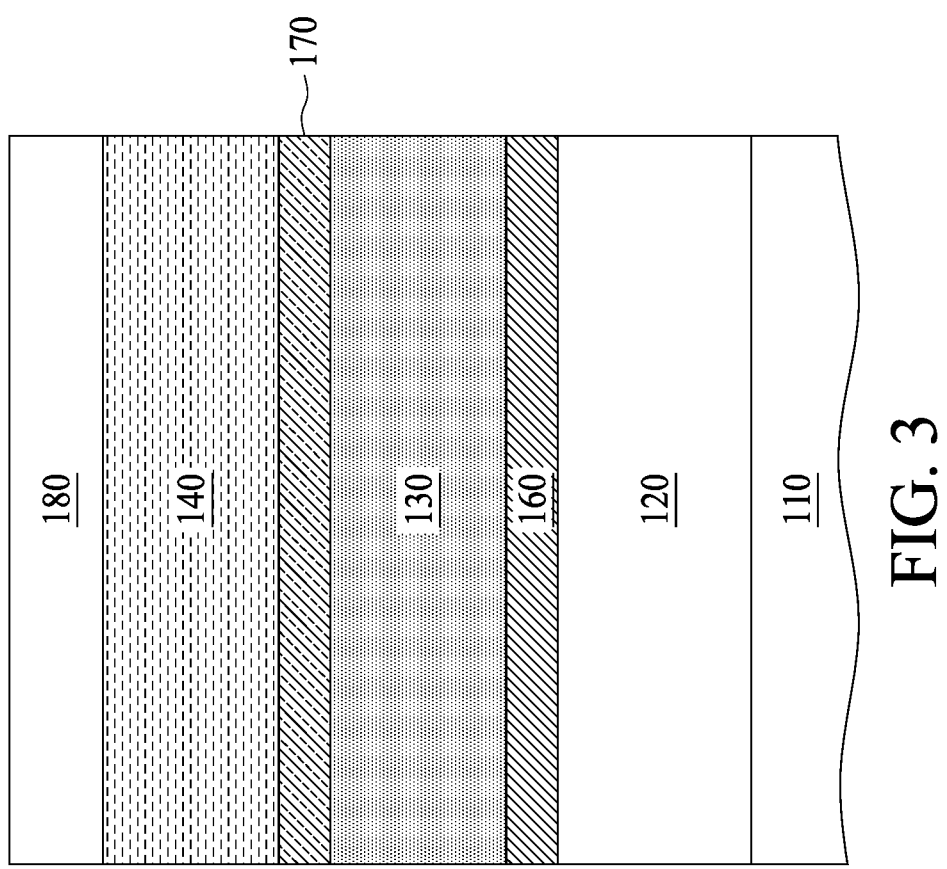
FIGS. 3 through 9 illustrate cross-sectional views of intermediate stages in the formation of a semiconductor structure in accordance with some embodiments of the present disclosure.

Referring to FIG. 3, a semiconductor substrate 110 is provided according to a step 202 in FIG. 2. In some embodiments, the semiconductor substrate 110 is a bulk substrate. In some embodiments, examples of the material suitable for the semiconductor substrate 110 include, but are not limited to, silicon, silicon on insulator, and silicon on sapphire.

Next, an insulating layer 120, a metallic layer 130 and a capping layer 140 are formed over the semiconductor substrate 110 according to a step 204 in FIG. 2. In some embodiments, the insulating layer 120 is in contact with the semiconductor substrate 110. In some embodiments, the insulating layer 120 includes oxide such as silicon dioxide ($SiO_2$). In some embodiments, the insulating layer 120 is formed using a chemical vapor deposition (CVD) process or a thermal oxidation process.

In some embodiments, the metallic layer 130 is deposited on the insulating layer 120. In some embodiments, the metallic layer 130 includes aluminum (Al), copper (Cu), or a combination thereof, e.g., aluminum copper (AlCu). In some embodiments, the metallic layer 130 may be separated from the insulating layer 120 by a barrier layer 160. In some embodiments, the barrier layer 160 may improve adhesion of the metallic layer 130 to the insulating layer 120. In some embodiments, the barrier layer 160 may be a single-layered structure or a multi-layered structure. In some embodiments, refractory metals, refractory metal nitrides, and combinations thereof are typically used for the barrier layer 160. In some embodiments, the barrier layer 160 may include titanium (Ti), titanium nitride (TiN), tantalum (Ta), tantalum nitride (TaN), titanium silicon nitride (TiSN), tantalum silicon nitride (TaSiN), or the like. In some embodiments, the barrier layer 160 may be formed by a physical vapor deposition (PVD) process or a CVD process, for example.

The capping layer 140 is disposed on the metallic layer 130. In some embodiments, the capping layer 140 acts as a hard mask for patterning the metallic layer 130. In some embodiments, the capping layer 140 includes dielectric such as nitride.

In order to eliminate problems associated with back reflection of light during the patterning of the capping layer 140, it is common to form an anti-reflective coating (ARC) layer 170 between the metallic layer 130 and the capping layer 140. In some embodiments, the ARC layer 170 may be a single-layered structure or a multi-layered structure.

In some embodiments, the ARC layer 170 includes tantalum (Ta), tantalum nitride (TaN), titanium (Ti) or titanium nitride (TiN) when it is a single-layered structure. In some embodiments, the ARC layer 170 may be formed by a PVD process or a CVD process, for example.

Figure 4:
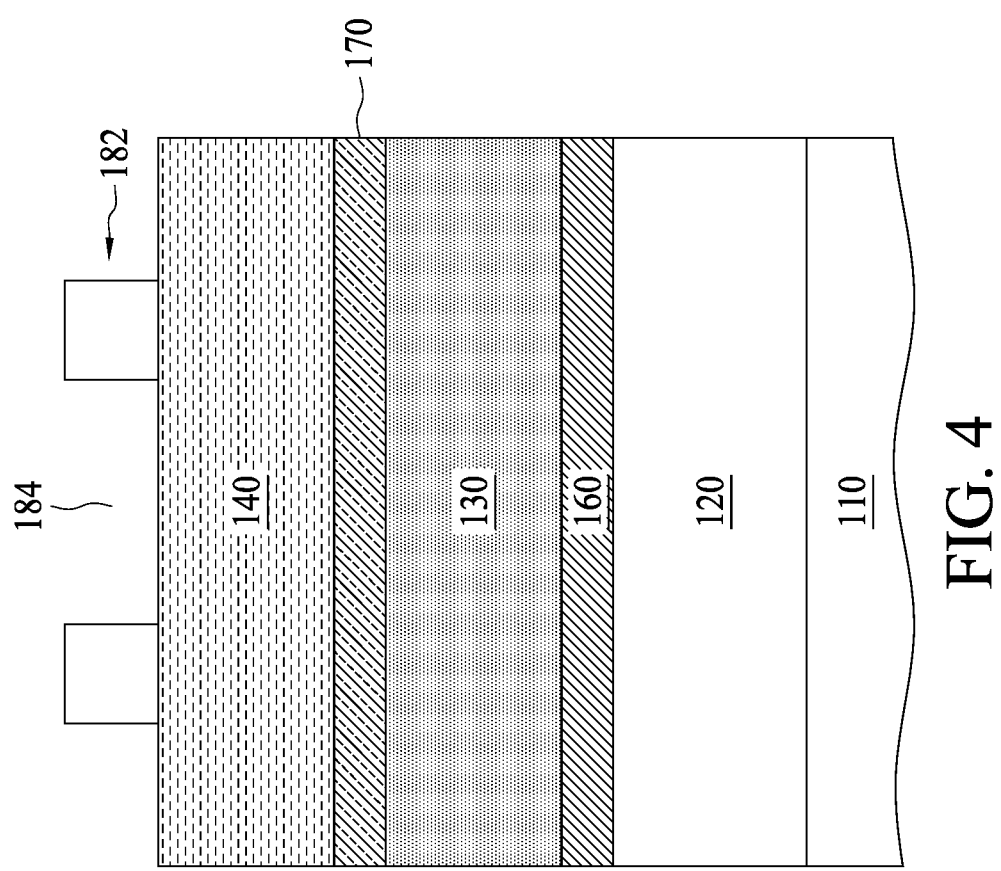

Next, a photoresist layer 180 is coated on the capping layer 140 according to a step 206 in FIG. 2. In some embodiments, the photoresist layer 180 is then patterned to define a region where the capping layer 140 and the ARC layer 170 are to be subsequently etched according to a step 208 in FIG. 2. In some embodiments, the photoresist layer 180 is patterned by steps including (1) exposing the photoresist layer 180 to a pattern (not shown), (2) performing a post-exposure back process, and (3) developing the photoresist layer 180, thereby forming a photoresist pattern 182, as shown in FIG. 4, having at least one opening 184. In some embodiments, a portion of the capping layer 140 to be subsequently etched is exposed through the openings 184.

Figure 5:
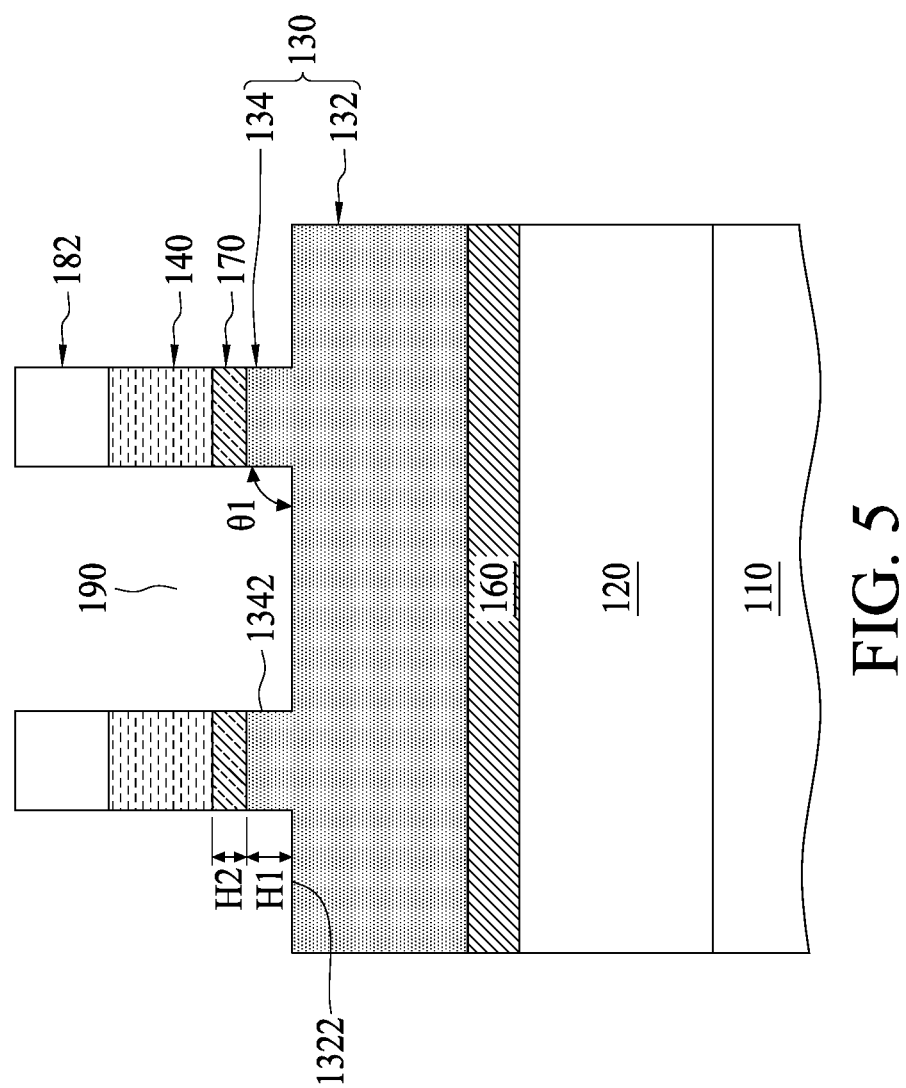

Referring to FIG. 5, in some embodiments, a patterning process is performed to etch the capping layer 140 and the ARC layer 170 according to a step 210 in FIG. 2. Accordingly, at least one trench 190 penetrating through the capping layer 140 and the ARC layer 160 and in the metallic layer 130 are formed. In some embodiments, the etching process includes a dry etching process. In some embodiments, the dry etching process may be an anisotropic etching process.

In some embodiments, the remaining metallic layer 130 includes a base 132 and a plurality of protrusions 134 extending from a surface 1322 of the base 132. In some embodiments, a height H1 of the metallic protrusions 134 is greater than twice a height of the ARC layer 170. In some embodiments, an included angle θ1 between sidewalls 1342 of the protrusions 134 and the surface 1322 may be equal to 90 degrees. In some embodiments, the remaining ARC layer 170 and the remaining capping layer 140 overlap the protrusions 134. In some embodiments, a width of the metallic protrusions 134 is defined by a width of the photoresist pattern 182.

Figure 6:
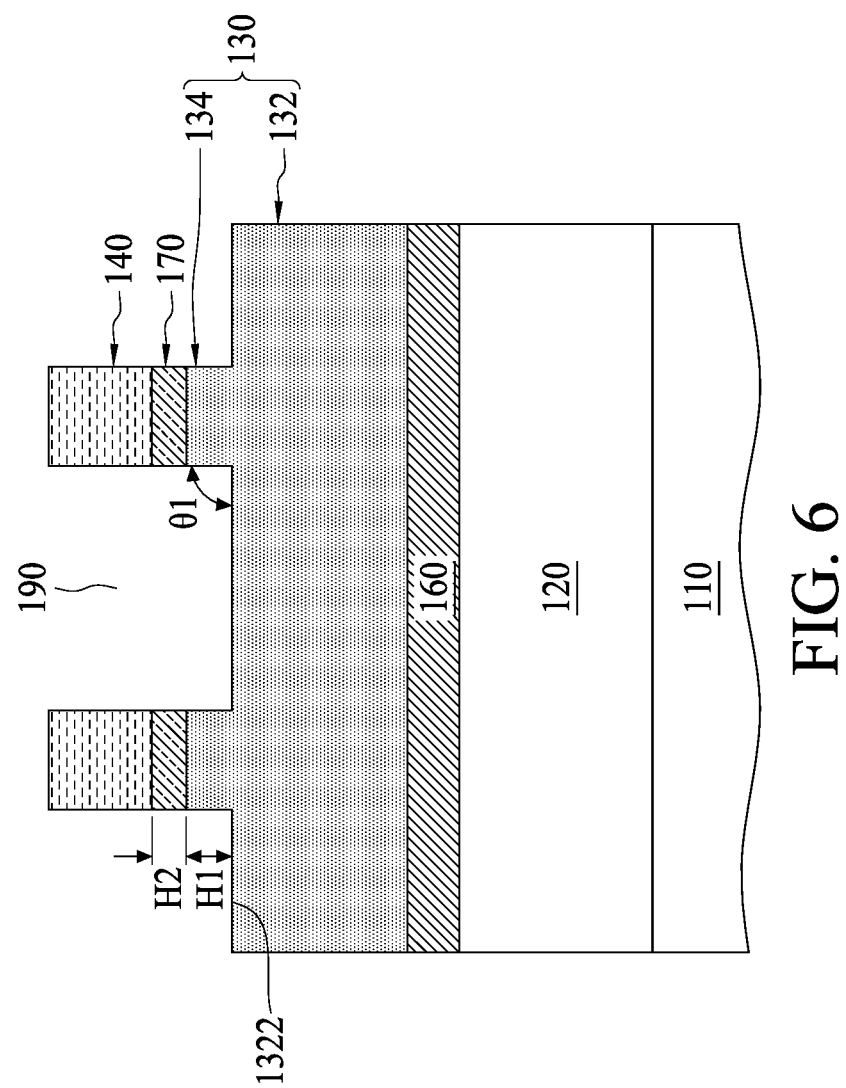

Referring to FIG. 6, after the patterning process, the photoresist pattern 182 is removed according to a step 212 in FIG. 2. In some embodiments, an ashing process or a wet strip process may be used to remove the photoresist pattern 182, wherein the wet strip process may chemically alter the photoresist pattern 182 so that it no longer adheres to the remaining capping layer 140.

Figure 7:
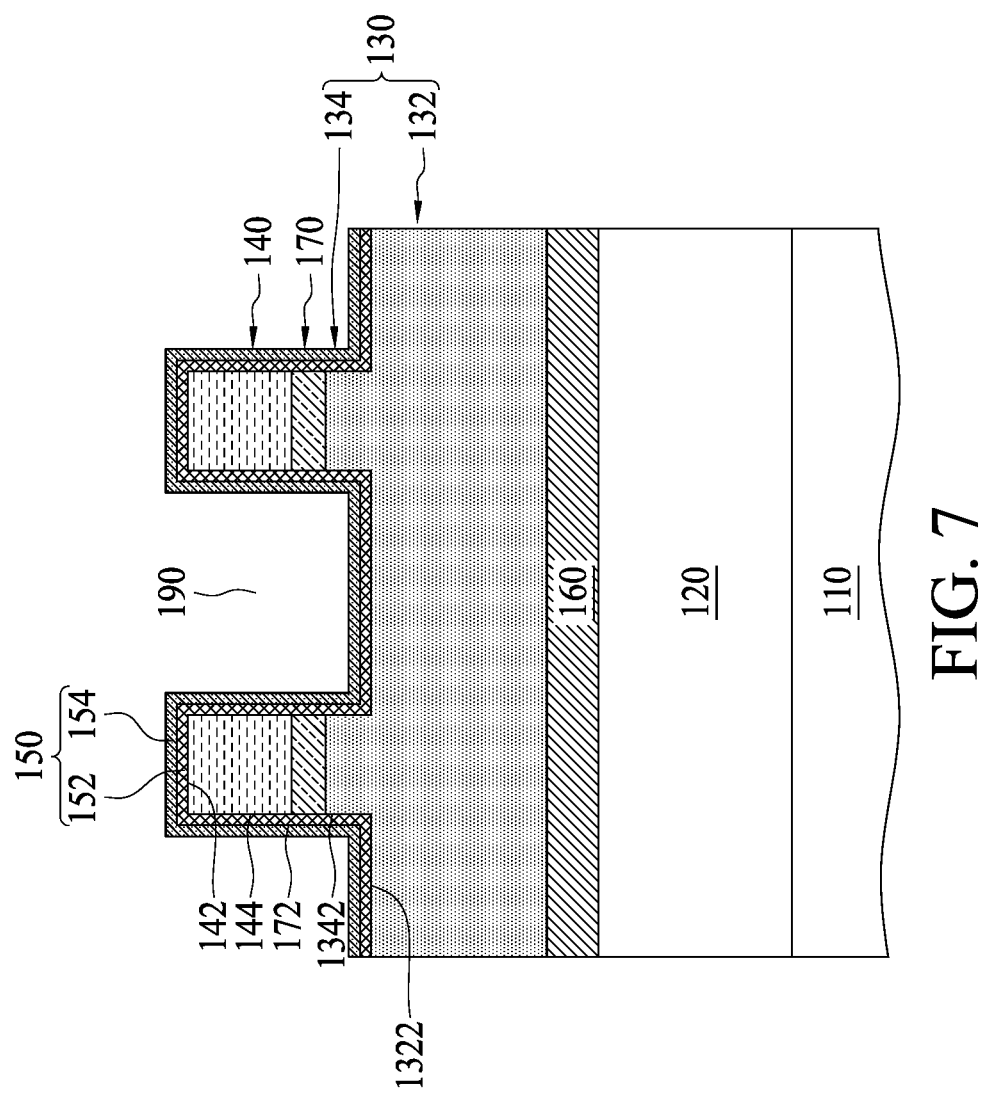

Referring to FIG. 7, in some embodiments, a passivation layer 150 is deposited on the capping layer 130 and into the trenches 190 according to a step 214 in FIG. 2. In some embodiments, the passivation layer 150 is deposited on a top surface 142 of the capping layer 140, sidewalls 144 of the capping layer 140, sidewalls 172 of the ARC layer 170, sidewalls 1342 of the protrusions 134, and the upper surface 1322 of the base 132. In some embodiments, the passivation layer 150 is a substantially conformal layer. In some embodiments, the passivation layer 150 has a uniform thickness. In some embodiments, the passivation layer 150 includes two or more atomic layer deposition (ALD) oxides. In some embodiments, the passivation layer 150 may include at least one first layer 152 and at least one second layer 154 arranged in a staggered configuration. In some embodiments, the first layer 152 includes silicon dioxide. In some embodiments, the second layer 154 includes zirconium dioxide or hafnium dioxide. In some embodiments, the passivation layer 150 may be formed using atomic layer deposition processes.

Figure 8:
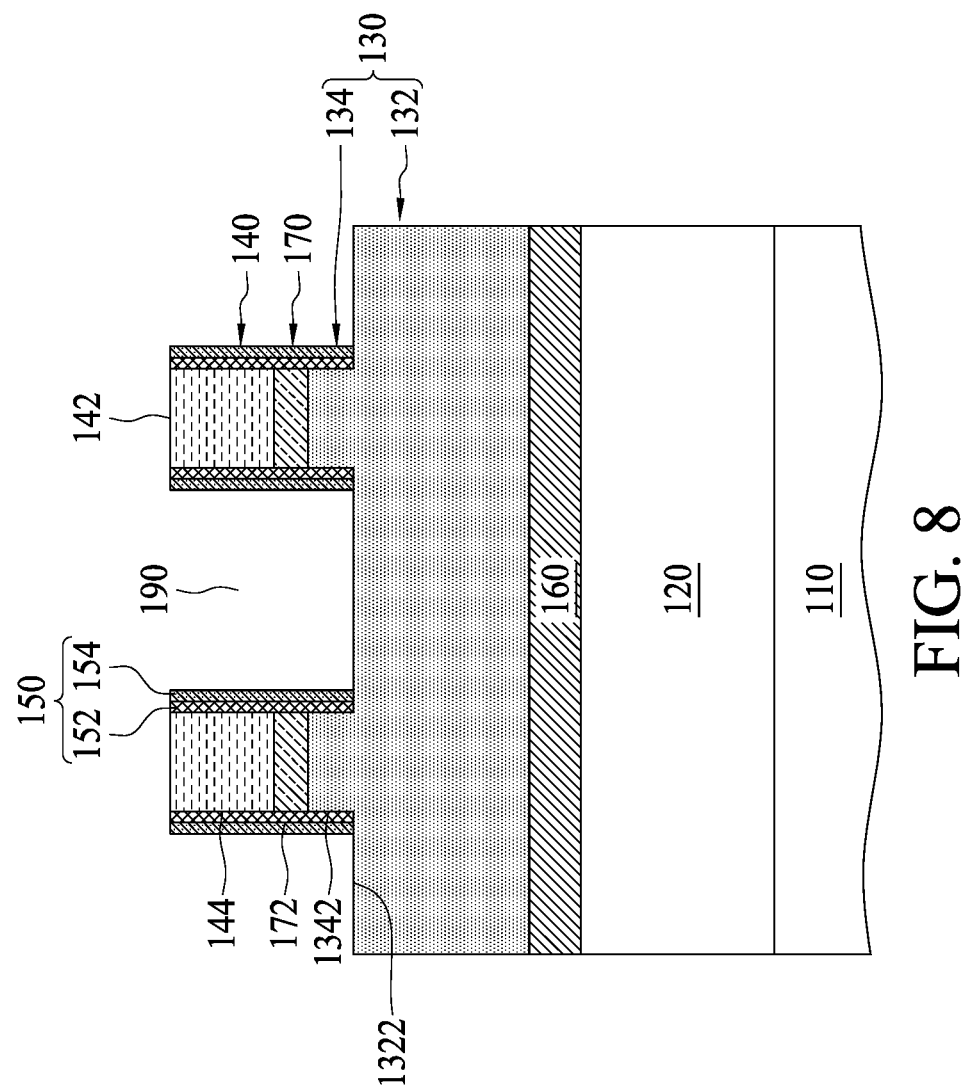

Referring to FIG. 8, in some embodiments, a portion of the passivation layer 150 is removed to expose the top surface 142 and the upper surface 1322. In some embodiments, the portion of the passivation layer 150 disposed on the top surface 132 and upper surface 1322 is removed, while the portion of the passivation layer 170 disposed on the sidewalls 144, 172, 1342 is left to protect against undercutting or notches in the protrusions 134 when the base 132 is subsequently etched. In some embodiments, the portion of the passivation layer 150 is removed using an anisotropic etching process.

Figure 9:
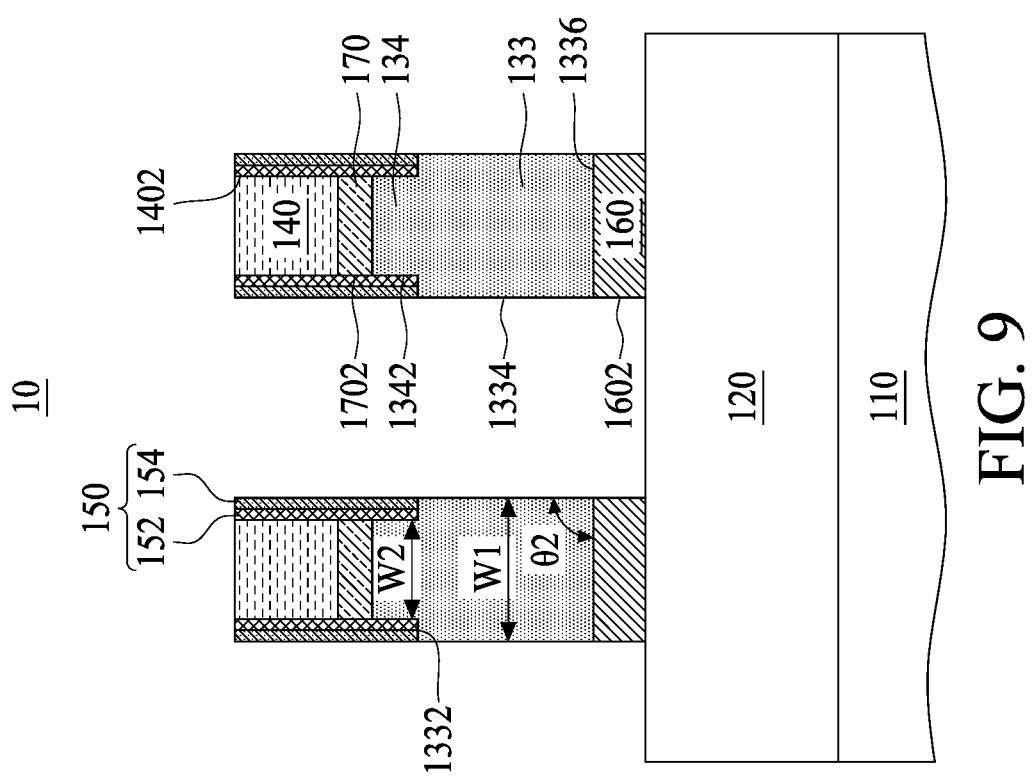

Referring to FIG. 9, in some embodiments, the base 132 and the barrier layer 160 are etched through the trenches 190 (shown in FIG. 8) to form a plurality of metallic pillars 133 underlying the respective metallic protrusions 134 according to a step 216 in FIG. 2. Accordingly, the semiconductor structure 10 is completely formed. In some embodiments, the metallic pillar 133 has a sidewall 1334 and a bottom surface 1336 adjacent to the sidewall 1334. In some embodiments, an included angle θ2 between sidewalls 1334 and the bottom surface 1336 is in a range between 80 and 90 degrees. In some embodiments, the base 132 and the barrier layer 160 are etched using an etching process, such as a reactive ion etching (RIE) process. In some embodiments, the RIE etching process utilizes $Cl_2$ and $BCl_3$ etchant gasses got the removal of the exposed portions of the base 132 and the barrier layer 160 to from the metallic pillars 133. In some embodiments, the etching process stops at the insulating layer 120.

One aspect of the present disclosure provides a semiconductor structure. The semiconductor structure includes a substrate, a plurality of metallic pillars, a plurality of metallic protrusions, a capping layer, and a passivation layer. The metallic pillars are disposed on the substrate. The metallic protrusions extend from an upper surface of the metallic pillars. The capping layer is disposed on the metallic protrusions. The passivation layer is disposed on sidewalls of the protrusions and the capping layer.

One aspect of the present disclosure provides a method of manufacturing the semiconductor structure. The method includes steps of providing a substrate; depositing a metallic layer and a capping layer on the substrate; patterning the capping layer to form a plurality of trenches penetrating through the capping layer and in the metallic layer, wherein the remaining metallic layer includes a base and a plurality of metallic protrusions connected to the base; depositing a passivation layer on sidewalls of the capping layer and the metallic protrusions; and patterning the base through the trenches to form a plurality of metallic pillars underlying the respective metallic protrusions.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor structure, comprising:
a substrate;
a plurality of metallic pillars disposed on the substrate;
a plurality of metallic protrusions extending from an upper surface of the metallic pillars;
a plurality of capping layers disposed on the plurality of metallic protrusions, wherein each of the plurality of capping layers overlaps each of the plurality of metallic protrusions and each of the plurality of capping layers has a width substantially the same as a width of each of the plurality of metallic protrusions; and
a passivation layer disposed on sidewalls of the metallic protrusions and the capping layer.

2. The semiconductor structure of claim 1, wherein the sidewalls of the metallic protrusions are discontinuous with sidewalls of the metallic pillars.

3. The semiconductor structure of claim 2, wherein the metallic protrusions have the width substantially less than a width of the metallic pillars.

4. The semiconductor structure of claim 1, wherein an included angle between a sidewall and a bottom wall of the metallic pillar is in a range between 80 and 90 degrees.

5. The semiconductor structure of claim 1, further comprising an anti-reflective coating layer sandwiched between the metallic protrusion and the capping layer.

6. The semiconductor structure of claim 5, wherein the metallic protrusions have a height substantially greater than twice a height of the anti-reflective coating layer.

7. The semiconductor structure of claim 1, further comprising:
an insulating layer separating the metallic pillars from the substrate; and
a barrier layer sandwiched between the insulating layer and the metallic pillars.

8. The semiconductor structure of claim 1, wherein the passivation layer comprises at least one first layer and at least one second layer arranged in a staggered configuration.

9. The semiconductor structure of claim 1, wherein the metallic pillars and the metallic protrusions are integrally formed.

10. The semiconductor structure of claim 1, wherein an outer periphery of the passivation layer is continuous with the sidewalls of the metallic pillars.

* * * * *